(12) United States Patent
Fukuda et al.

(10) Patent No.: US 7,596,162 B2
(45) Date of Patent: Sep. 29, 2009

(54) METHOD FOR FORMING A COATING FILM ON A FACET OF A SEMICONDUCTOR LASER DIODE

(75) Inventors: Chie Fukuda, Yokohama (JP); Hiroyuki Ichikawa, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 60 days.

(21) Appl. No.: 11/896,457

(22) Filed: Aug. 31, 2007

(65) Prior Publication Data

US 2008/0089377 A1    Apr. 17, 2008

(30) Foreign Application Priority Data

Sep. 1, 2006    (JP)    ............................. 2006-237978

(51) Int. Cl.
*H01S 5/00* (2006.01)
(52) U.S. Cl. ................................ 372/49.01; 372/46.013
(58) Field of Classification Search .............. 372/43.01, 372/49.01, 50.1, 46.013, 46.015
See application file for complete search history.

(56) References Cited

U.S. PATENT DOCUMENTS 6,990,133 B2 *    1/2006    Kikawa et al. ............ 372/49.01
2008/0291961 A1 *    11/2008    Kamikawa et al. ....... 372/49.01

FOREIGN PATENT DOCUMENTS

JP        62-230076        10/1987

* cited by examiner

*Primary Examiner*—Armando Rodriguez
(74) *Attorney, Agent, or Firm*—Smith, Gambrell & Russell, LLP

(57) ABSTRACT

The present invention is to provide a method for producing a semiconductor laser diode (LD) with an enhanced ESD resistance. The method includes a step for forming an aluminum film on a facet of the LD and a step for forming an aluminum oxide film on the aluminum film. The underlying aluminum film is oxidized during the formation of the aluminum oxide film to form a double aluminum oxide layer. The ratio of the oxide composition of the underlying aluminum oxide film is smaller than that of the upper aluminum oxide film.

10 Claims, 5 Drawing Sheets

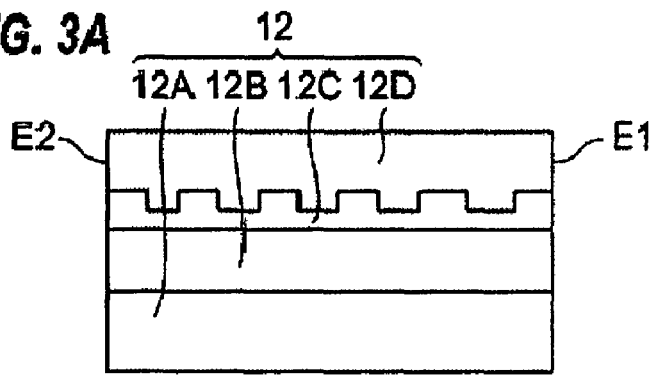
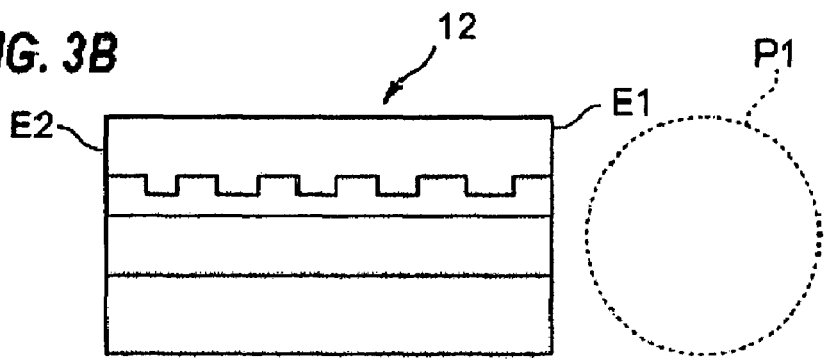
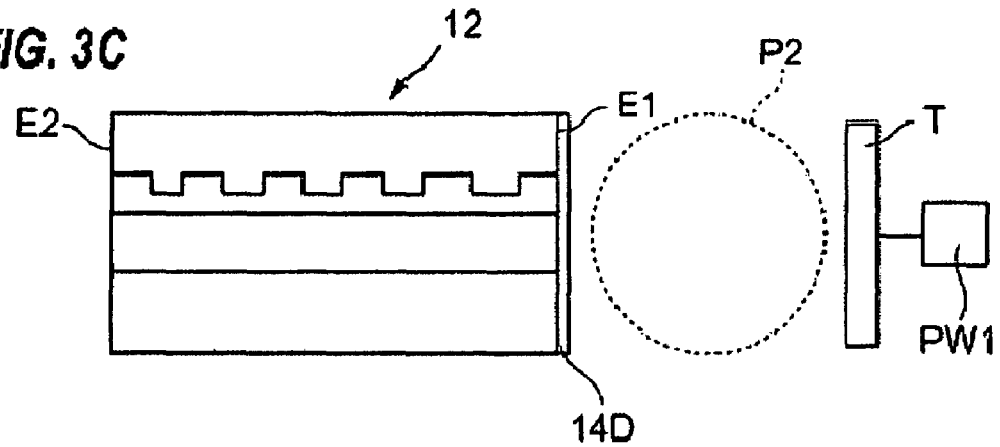
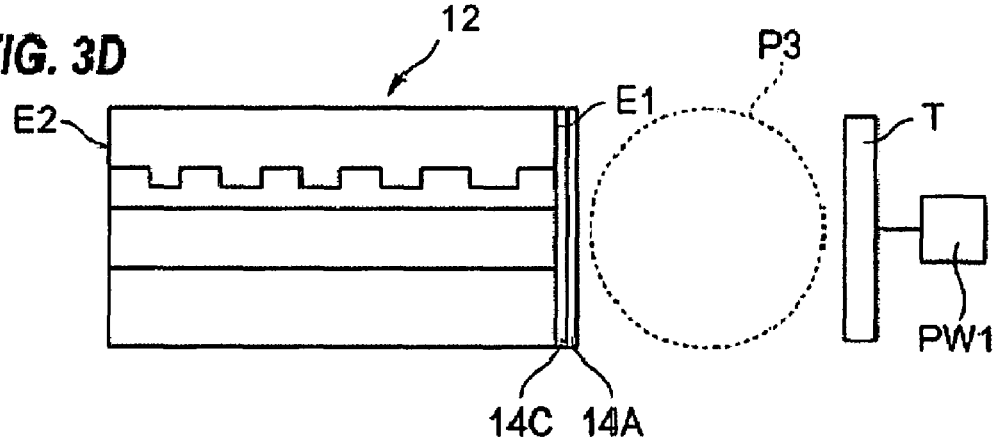

METHOD FOR FORMING A COATING FILM ON A FACET OF A SEMICONDUCTOR LASER DIODE

BACKGROUND OF THE INVENTION

1. Field of the Invention

The present invention is to provide a method for forming a coating film on a facet of a semiconductor laser diode, in particular, the invention provides a method to enhance the ESD resistance of the laser diode.

2. Related Prior Art

It has been well known to coat the facet of the semiconductor laser diode (hereafter denoted as LD) by a combination of films of an aluminum oxide film, $Al_2O_3$, and a silicon oxide film, $SiO_2$. It has been also well known that the LD is necessary to further enhance the electro-static discharge (hereafter denoted as ESD) resistance.

The present invention is to provide a method to form the LD with relatively higher ESD resistance.

SUMMARY OF THE INVENTION

One aspect of the present invention relates to a method for producing a semiconductor laser diode, in particular, the method relates to a method to form a coating on at least one facet of the LD. The method comprises, (1) forming an aluminum film on the facet of the laser LD by a sputtering technique, and (2) forming an aluminum oxide film on the aluminum film by the sputtering technique with plasma generated by a mixture of an inert gas and oxygen.

Because the second sputtering uses the oxygen-including plasma, this plasma may oxidize the aluminum film deposited in advance to convert an aluminum oxide film, which reduces the oxide composition within the film converted from the aluminum film, hence, the process may enhance the ESD resistance of the LD. The process may further includes a step, before forming the aluminum film on the facet of the LD, for exposing the face to the plasma generated by only the inert gas, which makes the facet in contamination free.

Another aspect of the present invention relates to an LD, in particular, the invention relates to a configuration of a film coating at least one facet of the LD. The coating film of the invention includes a first aluminum oxide film formed on the at least one facet of the LD, and a second aluminum oxide film formed on the first aluminum film. In the present coating film, an oxide composition of the first aluminum oxide film is smaller than an oxide composition of the second aluminum oxide film. The thickness of the first aluminum oxide film may be greater than 2 nm and smaller than 10 nm.

The coating film may include a titanium oxide film formed on the second aluminum oxide film. The coating film may further include a plurality of composite films of an aluminum oxide film with a titanium oxide film alternately stacked to each other. The coating film may be an anti-reflecting film with the reflectivity less than 0.5%, or a high-reflecting film with the reflectivity greater than 80% for an emission wavelength of the LD.

BRIEF DESCRIPTION OF DRAWINGS

FIGS. 3A to 3D schematically shows processes to form the coating film according to the present invention;

DESCRIPTION OF PREFERRED EMBODIMENTS

Next, embodiments of the present invention will be described as referring to accompanying drawings. In the description of the drawings, the same symbols and numerals will refer to the same elements without overlapping explanations.

First Embodiments

Figure 1:
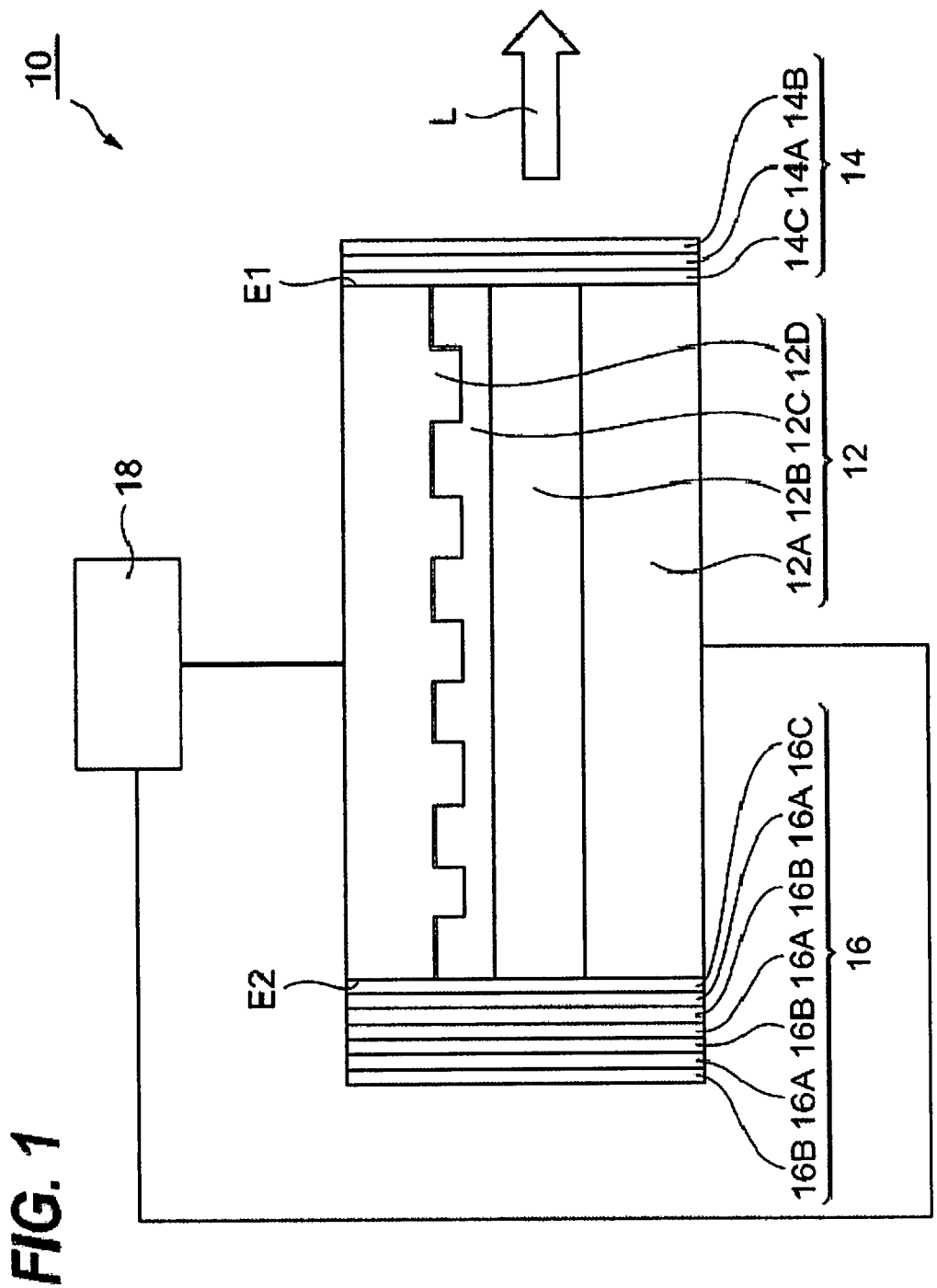
FIG. 1 is a schematic diagram of a semiconductor laser diode according to the first embodiment of the invention.

FIG. 1 is a schematic drawing of a semiconductor laser diode (hereafter denoted as LD) according to the first embodiment of the present invention. The LD 10 shown in FIG. 1, which is widely applied to the optical communication, provides a body with facets E1 and E2 arranged in both ends of the body, a coating film 14 for the facet E1 and another coating film 16 for the other facet E2. The former film 14 is a type of anti-reflecting (AR) film, while, the latter film 16 is a type of high-reflecting (HR) film. The coherent light is emitted from the AR film 14, in other words, the facet E1 is a light-emitting facet, while, the other facet E2 is a light-reflecting facet.

The LD 10 may be, for instance, a distributed feedback LD (hereafter denoted as DFB-LD). The body 12 includes a first cladding layer 12A of the first conduction type, an active layer 12B provided on the first cladding layer, a grating layer 12C provided on the active layer 12B, and a second cladding layer 12D provided on the grating layer 12C. The first and second cladding layers, 12A and 12D, may be called as the lower and upper cladding layers, respectively. These layers, 12A to 12D, may be made of group III-V compound semiconductor materials, such as InP based material, GaAs based material, AlAs based material and GaN based material, or composites of these materials. The active layer 12B may be made of GaInAsP. For this material, the emission wavelength of the LD 10 becomes 1.31 µm. The upper and lower cladding layers, 12A and 12D, may be electrically connected to the power supply 18. Providing the driving current from the power supply 18 to the active layer 12B through the cladding layers, 12A and 12D, the LD 10 may emit laser light L.

The first coating film 14 comprises a first aluminum oxide film 14C on the facet E1 and a second aluminum oxide film 14A provided on the first aluminum oxide film 14C. The composition of oxide atoms to the aluminum atoms in the first aluminum oxide film 14C is smaller than that in the second aluminum oxide film 14A. That is, assuming that two aluminum oxide films are $Al_{X1}O_{Y1}$ and $Al_{X2}O_{Y2}$, respectively, then, the composition of the oxide atom becomes Y1<Y2 for the case X1=X2. Each composition, X1, X2, Y1, and Y2, can be estimated by, for instance, X-ray photo-spectroscopy, XPS. One exemplary material for $Al_{X2}O_{Y2}$ is $Al_2O_3$.

On the second aluminum oxide film 14A is provided with a titanium (Ti) oxide film 14B. In a modification, on the first aluminum oxide film 14C may be provided with a plurality of combinations each including the second aluminum oxide film 14A and the titanium oxide films 14B, that is, the second aluminum oxide films 14A and the titanium oxide films 14B are alternately stacked to each other. The thickness of the first aluminum oxide film 14C is preferably greater than 2 nm and smaller than 10 nm, and is preferably smaller than one tenth of the thickness of the second aluminum oxide film 14A.

The other coating film 16 provides a similar configuration to the first coating film 14. That is, the film 16 may provide a first aluminum oxide film 16C on the facet E2 and a second aluminum oxide film 16A on the first aluminum oxide film 16A, and a ratio of the oxide composition to that of the aluminum in the first film 16C is smaller than that in the second film 16A. Assuming the first and second films are $Al_{X1}O_{Y1}$ and $Al_{X2}O_{Y2}$, respectively, the composition for the oxide becomes Y1<Y2 when the composition for the aluminum is X1=X2. The second film 16A may be $Al_2O_3$.

Similar to the first coating film 14, on the second aluminum oxide film 16A may be provided with a titanium film 16B. The embodiment alternately stacks a plurality of aluminum oxide films 16C and a plurality of titanium oxide films 16B. The thickness of the first aluminum oxide film 16C is preferably greater than 2 nm and smaller than 10 nm, and is preferably smaller than one tenth of the thickness of the second aluminum film 16A.

The configuration described above for the LD 10 makes it possible to enhance the ESD (Electro-Static Discharge) resistance, partly because two facets E1 and E2 provides respective films 14C and 16C with less composition for the oxygen, and because two facets E1 and E2, when the body 12 includes a semiconductor material with phosphorous (P) as an compositional element thereof, show less dislocations due to the dissociation of the phosphorous atoms.

The thickness of aluminum oxide films, 14C and 16C are preferable to be greater than 2 nm and smaller than 10 nm. The aluminum oxide film with less than 2 nm in the thickness thereof suppresses the enhancement of the ESD resistance, while, the aluminum oxide film with greater than 10 nm is likely to absorb the laser light L generated in the body 12 and to increase the leak current flowing within the aluminum oxide films, 14C and 16C.

Figure 2:
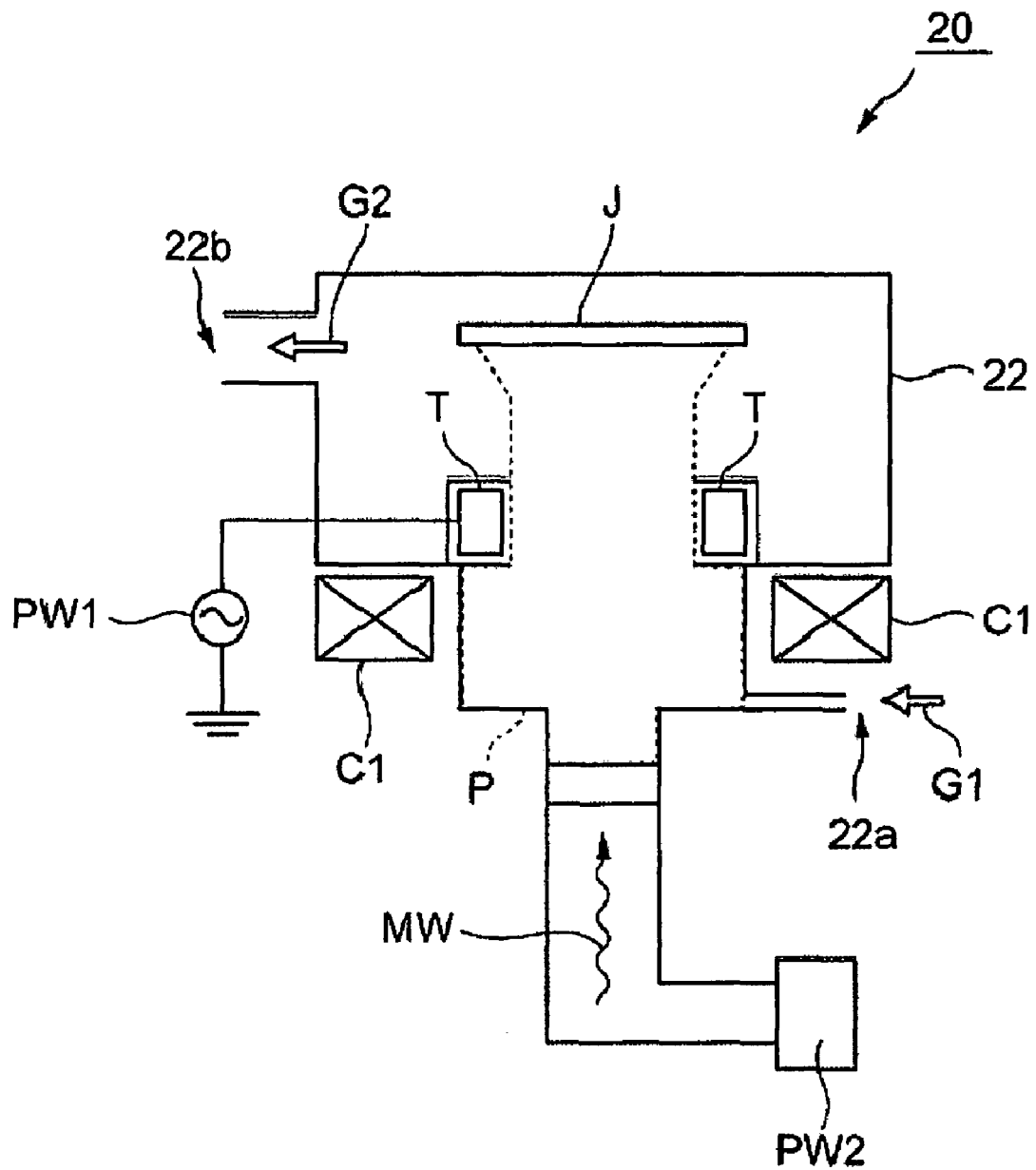
FIG. 2 schematically illustrates an apparatus to form a coating film on a facet of the laser diode.

Next, a process for forming the coating film of the present invention will be described. FIG. 2 schematically shows an apparatus 20 to form the coating film for the LD according to one embodiment of the invention. The apparatus 20 shown in FIG. 2 is a type of ECR (Electron-Cyclotron Resonance) sputtering system, which enables to form various types of aluminum oxide films, such as films E1 and E2 of the present embodiment.

The apparatus 20 comprises a vacuum chamber 22, a stage J set within the vacuum chamber 22 and fixes the body 12 thereon, and a target T of aluminum which is also installed within the vacuum chamber 22. The vacuum chamber 22 may further install a titanium (Ti) target. The target T is connected to the high frequency source PW1, while, the micro-wave power source PW2 generates a plasma P within the chamber 22. The magnetic coil C1, which surrounds the chamber 22, may control the distribution of the plasma P within the chamber 22. The chamber 22 provides an inlet 22a to supply the gas source G1 therein to generate the plasma P and an outlet 22b to exhaust the gas source G2. Inert gases such as argon (Ar) and nitrogen ($N_2$) or oxygen ($O_2$) may be used to generate the plasma P.

FIGS. 3A to 3D describe the process to form the coating films of the invention.

Preparation

First, the body 21 of the LD 10 is prepared. The body includes a plurality of semiconductor layers, namely, the lower cladding layer 12A, the active layer 12B, the grating layer 12C and the upper cladding layer 12d, on the InP Substrate. These semiconductor layers are processed. For example, the periodic undulation in the grating layer 12C may be formed by the combined process of the photolithographic technique with the etching. The body 12 may be obtained by, after the process treatment described above, cleaving the substrate 12A. The stage J on which the body 12 is set is installed within the vacuum chamber 22.

Specifically, a plurality of semiconductor layers including GaInAsP as an active layer and a grating layer was grown on the InP substrate, which had an emission wavelength of 1.31 μm and a type of DFB configuration. Cleaving the InP wafer in a nitrogen atmosphere formed a plurality of bars each having 300 μm width and 10 mm length. These bars were set on the stage J as each facet, where the AR coating was to be formed thereon, faces up.

Cleaning

After the setting of the stage J in the chamber, a cleaning of the facet E1 is carried out if necessary as shown in FIG. 3B. By exposing the body 12, in particular, the facet E1 thereof, to the plasma P1 generated by the inner gas source such as argon (Ar), the facet E1 may be cleaned. The symbol P1 appeared in FIG. 3B shows the plasma equivalent to the plasma P shown in FIG. 2.

Specifically, vacuuming the chamber until the pressure thereof becoming $1.0 \times 10^{-4}$ Pa, the Ar gas was imported within the chamber and the micro-wave source PW2 was turned on to generate the plasma. Under the stable condition of the plasma, the pressure within the chamber was kept to be 0.06 Pa. The cleaning was carried out for five minutes by powering off the high-frequency source PW1 and opening the shutter between the stage and the plasma.

Formation of Aluminum Film

Subsequently, the face E1 of the body 12 builds the aluminum film 14D thereon, as shown in FIG. 3C. The aluminum film 14D is formed by, for instance, the sputtering technique. Exposing the sputtering target T in the plasma P2 and biasing the target T with the high frequency source PW1, the aluminum particles rush out from the target T to reach the facet E1, which forms the aluminum film 14D. The plasma P2 in FIG. 3C corresponds to the plasma P shown in FIG. 2 and is generated from the Ar gas.

Specifically, once closing the shutter, powering the high-frequency source PW1 on, and adjusting the pressure within the chamber so as to keep 0.08 Pa by controlling the flow rate of the Ar gas, the circumstance for the sputtering was arranged. Opening the shutter deposited the aluminum film on the facet of the chip bar till the thickness thereof became 3 nm. The thickness of the aluminum film may be controlled by the period when the shutter between the stage J and the plasma is opened.

Practical thickness of deposited aluminum film may be measured by the XPS technique. Preparing an aluminum film formed on the InP by the same condition described above, the XPS analyzes the surface of this aluminum film as sputtering. Because the aluminum easily oxidizes and converts to the aluminum oxide in the atmosphere, the XPS detects the aluminum oxide. Hence, sputtering the aluminum film until the XPS detects no aluminum oxide and measuring the depth of the sputtered depression, the thickness of the aluminum film can be estimated from the sputtering rate of the film and the time until the XPS detects no aluminum oxide.

Formation of Aluminum Oxide Film

Next, an aluminum oxide film 14A is formed on the aluminum film 14D. The aluminum oxide 14A may be also formed by the sputtering in the apparatus 20. To exposing the target T to the plasma P3 generated by the mixture of the inner gas, for instance Ar, with the oxygen, and biasing the target T by the high frequency source PW1 forms the aluminum oxide film 14A. The aluminum film 14D is also oxidized by exposing the plasma P3. Hence, the aluminum oxide film 14C may be converted from the aluminum film 14D.

Specifically, closing the shutter and turning the high-frequency source on, and guiding the oxygen within the chamber in addition to the argon gas, the condition for the depositing of the aluminum oxide was completed. Keeping the pressure within the chamber to be 0.09 Pa and opening the shutter, the aluminum oxide film was deposited on the aluminum film. The thickness of the aluminum oxide film was 110 nm, which was similarly adjustable by the period the shutter is opened.

Formation of Titanium Oxide Film

Subsequently, the sputtering technique forms the titanium oxide film 14B on the aluminum oxide film 14A. Exposing the Ti target on the plasma generated by the mixture of the inert gas and the oxygen with biasing the Ti target by the high frequency source PW1, the titanium oxide film 14B may be formed. Thus, the first film on the facet E1 is formed.

Specifically, the stage J moved to a position where the Ti target positioned. Turning the high-frequency source connected to the Ti target on and opening the shutter, the titanium oxide film was deposited on the aluminum oxide film. The thickness of the titanium oxide film was 42 nm. The thickness of this titanium oxide film and the aluminum oxide film were designed such that the reflectivity of the coating film on the facet E1 became 0.5% or less for the wavelength of 1.31 µm, which was the emission wavelength of the DFB-LD.

Cleaning

Next, another facet E2 is cleaned by the same manner with those for the first facet as already described.

Formation of Aluminum Oxide Film and Titanium Oxide Film

Subsequently, the aluminum film 16D is formed by the sputtering on the facet E2 by the similar manner to those for the first facet, and this aluminum film 16D is also oxidized and converted to the aluminum oxide film 16C by the subsequent formation of the aluminum oxide film 16A. The titanium oxide 16B is formed on the aluminum oxide 16A. Depending on the characteristic of the completed film 16 on the facet E2, the process for forming the aluminum oxide 16A and the titanium oxide 16B are iterated. Thus, a plurality of aluminum oxide films 16A and a plurality of titanium oxide films 16B, respective films 16A and 16B being alternately stacked, are formed on the first aluminum oxide film 16C.

Specifically, carrying the stage J with the chip bars out from the chamber, these chip bars were set on the stage J again such that the other facet where the HR coating film was to be deposited faced up. Performing the similar processes to those carried out for the first facets of the chip bars, namely, the cleaning, the aluminum film formation, the aluminum oxide film formation concurrent with the oxidization of the aluminum film, and the titanium oxide film formation; the HR coating film was deposited on the other facet of the chip bars. The present embodiment formed three aluminum oxide films and three titanium oxide films stacked alternately to each other. Thicknesses of respective oxide films were designed such that the reflectivity of the HR coating film became 80% or greater for the wavelength of 1.31 µm. The aluminum oxide films were 200 nm in the thickness thereof while the titanium oxide films were 140 nm.

To divide the chip bar with the AR coating and the HR coating on the facets thereof completed a plurality of laser chips each having 300 µm length and 250 µm width.

The LD 10 may be thus completed. According to the present method, the aluminum film 14D may be oxidized concurrently to the formation of the second aluminum oxide film 14A. Similarly, the aluminum film 16D on the facet E2 may be oxidized at the formation of the aluminum oxide film 16A. Thus, the LD 10 with enhanced ESD resistance may be obtained.

The cleaning carried out in advance to the formation of the aluminum film enhances the adhesive strength of the aluminum film 14D to the facet E1 and that of the aluminum film 16D to the other facet E2, which enhances the ESD resistance of the LD 10, because the cleaning may clean the surface of the facets, E1 and E2, and remove the native oxides thereon.

Second Embodiment

Figure 4:
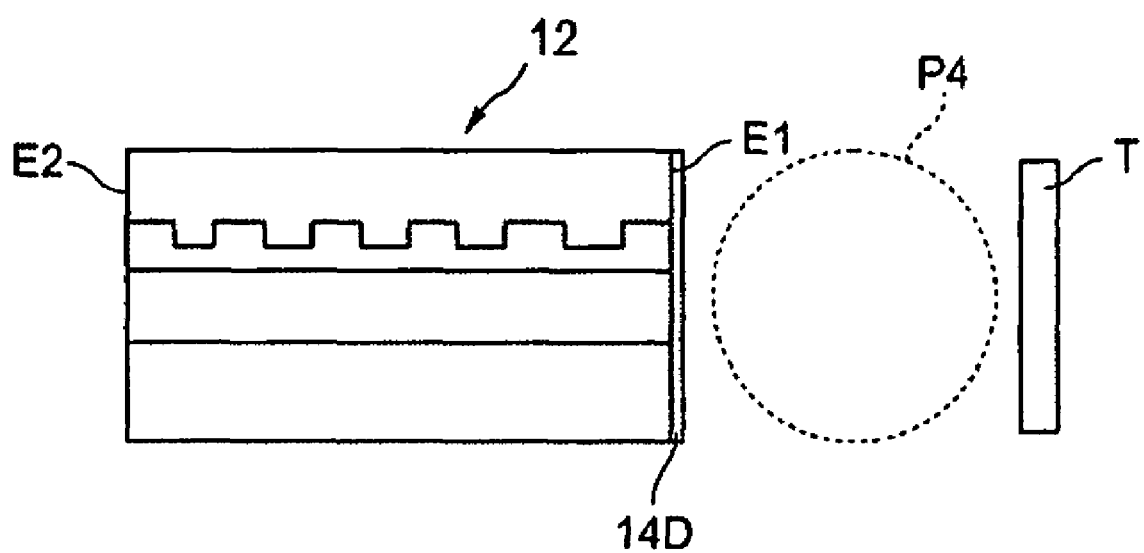
FIG. 4 shows a process to form the coating film for the laser diode according to the second embodiment of the invention.

FIG. 4 schematically shows a process to form an LD according to the second embodiment of the present invention. The present process provides different cleaning process and forming process for the aluminum film from those described in the first embodiment.

Cleaning and Formation of Aluminum Film

As shown in FIG. 4, exposing the facet E1 of the body 12 to the plasma P4 generated by the inert gas, such as Ar, and also exposing the target T to the plasma P4, the cleaning of the facet E1 and the depositing of aluminum film 14D on the facet E1 may be concurrently carried out.

The plasma P4 may be generated by the inert gas supplied within the chamber such that the pressure within the chamber becomes 0.06 Pa or less, where the mean free path of particles in the plasma P4, such as atoms, ions or radicals, may lengthen thus enhance the sputtering efficiency for the target T. Accordingly, the target T may be sputtered even when the high frequency source PW1 is disconnected thereto and the target is not biased. The pressure within the chamber is further preferable to be less than 0.03 Pa. The pressure may be adjusted by the flow rate of the inert gas and the capacity of the chamber 22.

Thus, in this embodiment shown in FIG. 4, the cleaning of the facet E1 and the depositing of the aluminum film on the facet E2 may be concurrently carried out by exposing the facet, E1 or E2, and the target T to the plasma P4, which not only shortens the process duration for the LD 10 but also performs the cleaning, the aluminum formation and the oxidization of the aluminum film sequentially without carrying the body out of the chamber 22.

Specifically, guiding the argon gas within the chamber when the pressure thereof became $1 \times 10^{-4}$ Pa and turning the microwave source on, the plasma generated within the chamber. In a stable condition of the plasma, the pressure of the chamber was kept 0.03 Pa. Moving the stage above the target and opening the shutter as the high-frequency source for the target turning off, five minutes sputtering carried out the cleaning of the facet concurrently with the depositing of the aluminum film. The thickness of the aluminum film was 2 nm.

Thus, the second embodiment described above may provide an LD with an enhanced ESD resistance because the adhesive strength of the aluminum film 14D to the first facet E1 and/or that of the aluminum film 16D to the other facet E2 may increase. Moreover, the concurrent process of the cleaning and the deposition of the aluminum film may not only shorten the total process period but also perform the cleaning, the aluminum formation and the oxidization of the aluminum film sequentially without carrying the body out of the chamber 22.

Thus, the present invention was described as referring to embodiments thereof. However, the invention is not restricted to those embodiments. For instance, although the embodiments describes both coating films, 14 and 16, provide the function of the present invention, it is assumed that one of coating films shows the present invention while the other of film shows a conventional characteristic. The conventional coating film may be, for instance, a combination of $Al_2O_3$ with $SiO_2$, or a simple combination of $Al_2O_3$ with $TiO_2$. Moreover, the present invention is applicable for cases of amorphous silicon film, zirconium oxide film, tantalum oxide film or silicon nitride film instead of the titanium oxide film, 14B or 16B.

Figure 5:
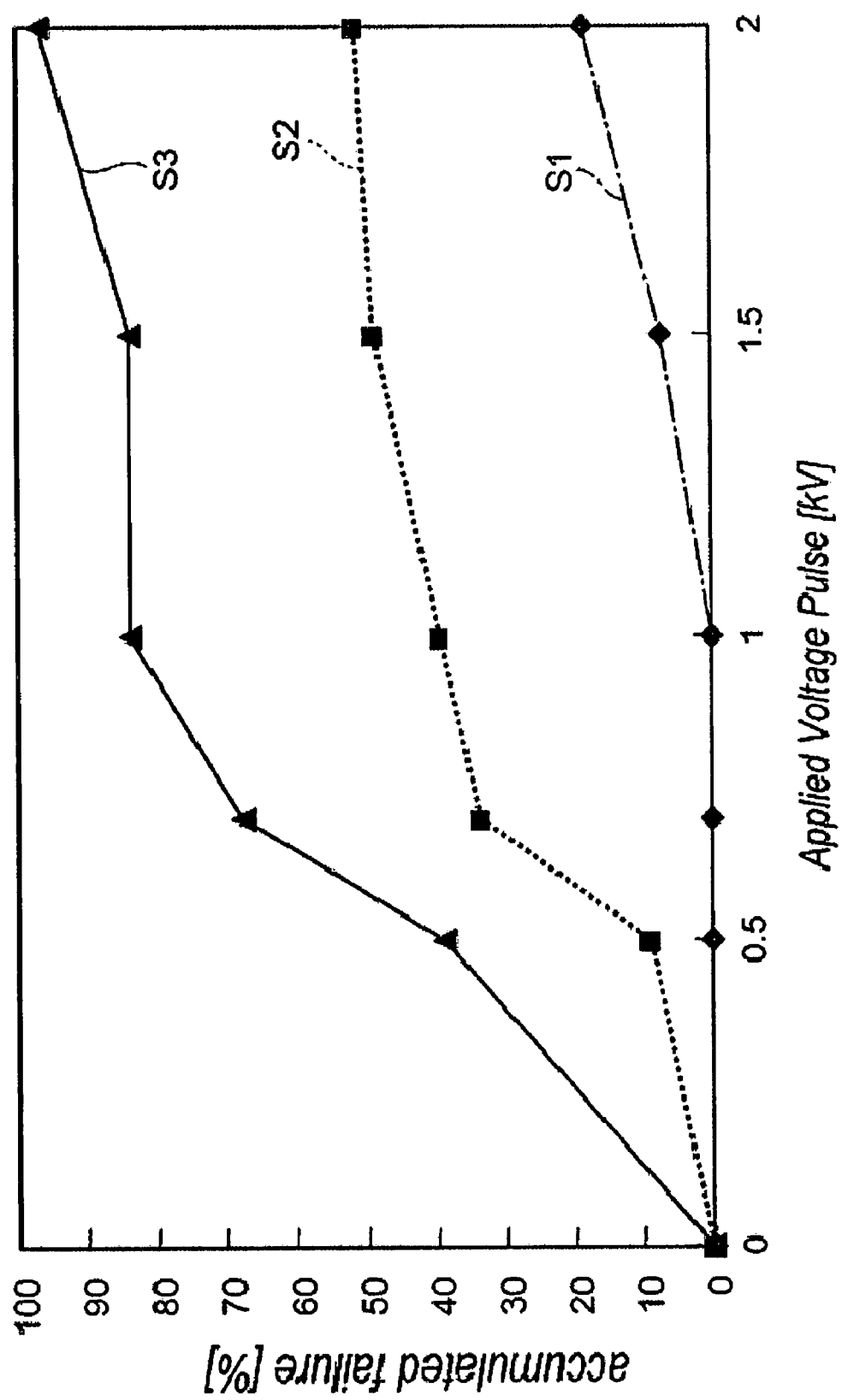
FIG. 5 compares the ESD resistance of samples obtained by the second embodiment of the invention and by the processes without the aluminum formation or the cleaning.

FIG. 5 compares the ESD resistance of samples S1 obtained by the process according to the second embodiment, samples S2 obtained by the process according to the first embodiment but without depositing of the aluminum film, and samples S3 obtained by the process according to the first embodiment but without cleaning and depositing the aluminum film. The vertical axis of FIG. 5 denotes the accumulated failure due to the ESD breakdown, while the horizontal axis denotes the ESD resistance by the human-body model, which means that applying the discharge pulse sequentially from zero to the maximum voltage, a pulse height of which is denoted in the horizontal axis and a pulse width thereof is defined by the human body model, the total count of samples broken by the discharge pulse. For example, applying the pulse with 500 V, about 40% came to breakdown for the samples S3. Subsequently, applying the 700 V pulse for the survived samples, about 30% came to break, the total of 70% of samples S3 came to break.

Therefore, for samples S1 obtained by the second process, 80% of samples (100−20=80%) can be survived after being applied ESD pulses of 500 V, 700 V, 1 kV, 1.5 kV and 2 kV. On the other hand, for samples S3 without the cleaning and the deposition of the first aluminum film, about 40% of the samples comes to be broken only by the application of the ESD pulse with 500 V and nearly 100% thereof comes to be broken after being applied sequential pulses above described.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. A method for producing a semiconductor laser diode which provides a body and two facets putting the body therebetween, the method comprising steps of:
    forming an aluminum film on at least one of two facets by a sputtering technique exposing an aluminum target to a plasma generated by an inert gas without biasing the aluminum target and concurrently cleaning the at least one facet of the laser diode; and
    forming an aluminum oxide film on the aluminum film by the sputtering technique with plasma generated by an inert gas and oxygen.

2. The method according to claim 1, further comprising a step, before forming the aluminum film, for exposing the at least one facet to the plasma generated by the inert gas to clean a surface of the at least one facet.

3. The method according to claim 1, wherein the process for forming the aluminum film and the process for forming the aluminum oxide film are performed by an electron-cyclotron sputtering.

4. A semiconductor laser diode, comprising:
    a body with an active layer for emitting light and a pair of facets putting the body therebetween; and
    a coating film provided on at least one of the facets, the coating film including a first aluminum oxide film formed on the at least one of the facets and a second aluminum oxide film formed on the first aluminum film,
    wherein the first aluminum oxide film has an oxide composition smaller than the oxide composition of the second aluminum oxide film, and the first aluminum oxide film has a thickness greater than 2 nm and less than 10 nm.

5. The semiconductor laser diode according to claim 4, wherein the body further includes a grating layer, the laser diode being a type of distributed feedback laser.

6. The semiconductor laser diode according to claim 4, wherein the coating film further includes a titanium oxide film provided on the second aluminum oxide film,
    wherein a plurality of composite films of an aluminum oxide film and a titanium oxide film alternately stacked are formed on the titanium oxide film, and
    wherein the coating film shows a high reflectivity at an emission wavelength of the laser diode.

7. The semiconductor laser diode according to claim 6, wherein the reflectivity of the coating film is greater than 80%.

8. The semiconductor laser diode according to claim 4, wherein the coating film further includes a titanium oxide film provided on the second aluminum oxide film to show anti-reflecting characteristics at an emission wavelength of the laser diode.

9. The semiconductor laser diode according to claim 8, wherein the reflectivity of the coating film is smaller than 0.5%.

10. A method for producing a semiconductor laser diode which provides a body and two facets putting the body therebetween, the method comprising the steps of:
    forming an aluminum film on at least one of two facets by a sputtering technique using an aluminum target and plasma generated by introducing an inert gas without oxygen within a chamber; and
    forming an aluminum oxide film on the aluminum film by the sputtering technique using the aluminum target and plasma generated by introducing an inert gas and oxygen.

* * * * *